United States Patent
Braceras et al.

(10) Patent No.: US 6,542,418 B2
(45) Date of Patent: Apr. 1, 2003

(54) REDUNDANT MEMORY ARRAY HAVING DUAL-USE REPAIR ELEMENTS

(75) Inventors: George M. Braceras, Essex Junction, VT (US); Patrick R. Hansen, Essex Junction, VT (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 09/892,026

(22) Filed: Jun. 26, 2001

(65) Prior Publication Data

US 2002/0196677 A1 Dec. 26, 2002

(51) Int. Cl.[7] .............................................. G11C 7/00
(52) U.S. Cl. ..................................... 365/200; 365/225.7
(58) Field of Search ............................... 365/200, 225.7

(56) References Cited

U.S. PATENT DOCUMENTS

| 5,293,348 A | | 3/1994 | Abe | |
|---|---|---|---|---|
| 5,469,390 A | * | 11/1995 | Sasaki et al. | 365/200 |
| 5,671,184 A | * | 9/1997 | Meyer | 365/200 |
| 5,708,613 A | * | 1/1998 | Creed et al. | 365/194 |
| 5,793,683 A | | 8/1998 | Evans | |
| 5,963,489 A | * | 10/1999 | Kirihata et al. | 365/149 |
| 5,991,211 A | * | 11/1999 | Kato et al. | 365/200 |
| 6,011,735 A | * | 1/2000 | Ooishi et al. | 365/200 |
| 6,011,742 A | | 1/2000 | Zheng | |
| 6,018,811 A | | 1/2000 | Merritt | |
| 6,038,179 A | * | 3/2000 | Eustis et al. | 365/200 |

* cited by examiner

Primary Examiner—Huan Hoang

(57) ABSTRACT

An integrated circuit memory structure includes a main array of memory elements having wordlines and bitlines and a redundant array of redundant memory elements external to and connected to the main array. Each of the redundant memory elements can replace either one of the wordlines or one of the bitlines.

20 Claims, 4 Drawing Sheets

REDUNDANT MEMORY ARRAY HAVING DUAL-USE REPAIR ELEMENTS

BACKGROUND OF THE INVENTION

1. Field of the Invention

The present invention generally relates to redundant arrays of a semiconductor memory array and more particularly to an improved redundant array, the elements of which can be used as either replacement bitlines or replacement wordlines.

2. Description of the Related Art

Semiconductor memory arrays often include redundant repair elements to improve product yield, especially when fabricating a product in a new technology or when a product design point is completely new. These redundant repair elements may be included as either additional wordlines and bitlines in the primary array or as an entirely separate redundant array. Separate redundant arrays consist of multiple bitline and wordline repair elements.

FIG. 1 illustrates the use of redundant wordlines 11 and bitlines 12 in the primary array 13. FIG. 2 illustrates the use of redundant wordline 20 and bitline 21 elements in a separate redundant array 22. Each repair element, whether incorporated into the primary array 13 or separated into a redundant array 22, can be mapped into the decode and data paths 14, 15 of the primary memory array 13 to replace faulty memory cells in the primary array. When a separate redundant array 22 is mapped into the decode paths of the primary array, the data from the redundant array is multiplexed with the data from the primary array with mux 23. This provides substantial performance benefits to large memory arrays (see U.S. Pat. No. 5,793,683, which is incorporated herein by reference). Thus, separate redundant array techniques are the focus of this disclosure.

Conventional systems use repair elements that are pre-designated for a single use, either a bitline repair element that replaces a single bitline (a grouping of cells common to a single sense-amplifier) in the primary array or a wordline repair element that replaces a single wordline (a grouping of cells with a common word line driver) in the primary array. These bitline and wordline repair elements exclusively replace either faulty bitlines or wordlines, respectively, in the primary array. Conventional systems also can include bitline repair elements that can replace multiple bitlines and word line elements which can replace multiple word lines. For the purposes of this disclosure, these conventional redundancy repair systems are referred to as having "single-use redundancy."

One problem with single-use redundancy is that each repair element is restricted in its use to the replacement of either a faulty bitline or a faulty wordline according to its predesignated function. This restriction limits the usefulness of each repair element in the redundant array. A redundant memory array might have a total of eight repair elements as in FIG. 2, where four of those elements are bitline repair elements 24 and the other four elements are wordline repair elements 25. Although the redundant array contains a total of eight repair elements, only four faulty bitlines and four faulty wordlines may be repaired. If the number of defective bitlines or wordlines exceeds 4, the array would not be able to be repaired and would have to be scrapped. The invention described allows each repair element in the redundant array to be used as either a bitline repair element or a wordline repair element. Using the invention, a redundant array containing eight repair elements can repair eight faulty bitlines or eight faulty wordlines, or any combination thereof up to a maximum of eight total repairs.

SUMMARY OF THE INVENTION

In view of the foregoing and other problems, disadvantages, and drawbacks of the conventional redundant memory arrays the present invention has been devised, and it is an object of the present invention to provide a structure and method for an improved redundant memory array that includes elements that can be used as either wordlines or bitlines.

In order to attain the object(s) suggested above, there is provided, according to one aspect of the invention, an integrated circuit memory structure that includes a main array of memory elements having wordlines and bitlines and a redundant array of redundant memory elements external to and connected to the main array. Each of the redundant memory elements can replace either one of the wordlines or one of the bitlines. The wordlines and the bitlines are the same size and the redundant memory elements are the same size as the wordlines and the bitlines.

The invention compares logic and corresponding fuses for identifying which one of the wordlines or the bitlines is replaced by each of the redundant memory elements. The fuses include two master fuses that identify whether each of the redundant memory elements replaces one of the bitlines or one of the wordlines. The invention includes at least one multiplexor/decoder for decoding a memory address to a corresponding address within the redundant memory array. The invention further includes a multiplexor for selectively connecting a data line to either the main array or the redundant array.

BRIEF DESCRIPTION OF THE DRAWINGS

The foregoing and other objects, aspects and advantages will be better understood from the following detailed description of a preferred embodiment(s) of the invention with reference to the drawings, in which.

DETAILED DESCRIPTION OF PREFERRED EMBODIMENTS OF THE INVENTION

As mentioned above one problem with single-use redundancy is that each repair element is restricted in its use to the replacement of either a faulty bitline or a faulty wordline according to its predesignated function. This restriction limits the usefulness of each repair element in the redundant array. The invention provides repair elements that have dual-use redundancy that allows each repair element in the redundant array to be used as either a bitline repair element or a wordline repair element.

Thus, the invention overcomes the limitations of single-use redundancy by allowing each repair element in the redundant array to be used as either a bitline repair element or a wordline repair element. By increasing the usefulness of each repair element, product yield may be held constant while the total number of repair elements may be reduced for a given memory array. Because each repair element requires programmable fuses (whether efuses or metal fuses), the invention also reduces the number of fuses required for a given array, which in turn reduces the total chip area and improves the chip wireability.

Dual-use redundancy is achieved by implementing the following design techniques. First, the invention constrains the dimensions and architecture of the primary array such that invoking a bitline repair replaces exactly the same number of cells in the primary array as invoking a wordline repair. Second, the invention includes two blocks of address compare logic per repair element. One block compares to the bitline compare addresses and another block compares to the wordline compare addresses. Third, the invention adds one fuse per repair element fuse bank to identify the use of each repair element as either a bitline repair element or as a wordline repair element. Finally, the invention uses a multiplexor to direct the address inputs to the redundant array decode logic to allow each repair element to be decoded as either a bitline or wordline replacement.

Figure 2:
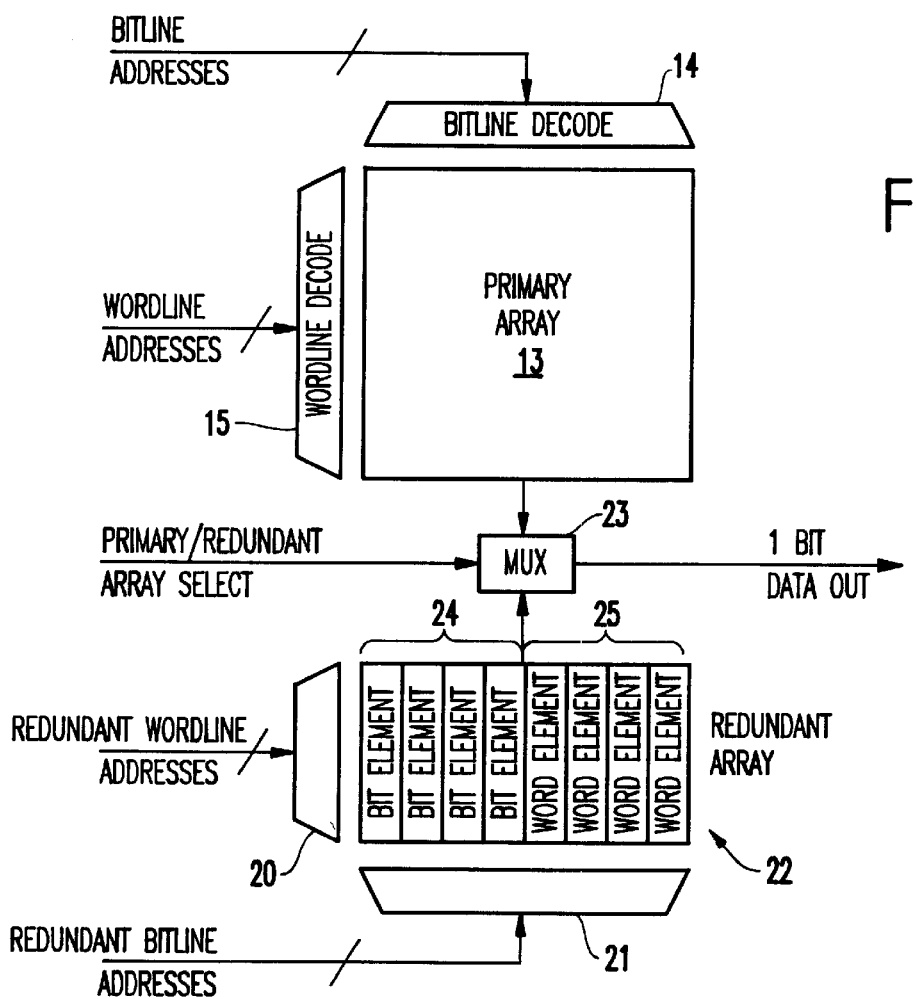
FIG. 2 is a schematic diagram of a memory array having redundant elements.
Figure 3:
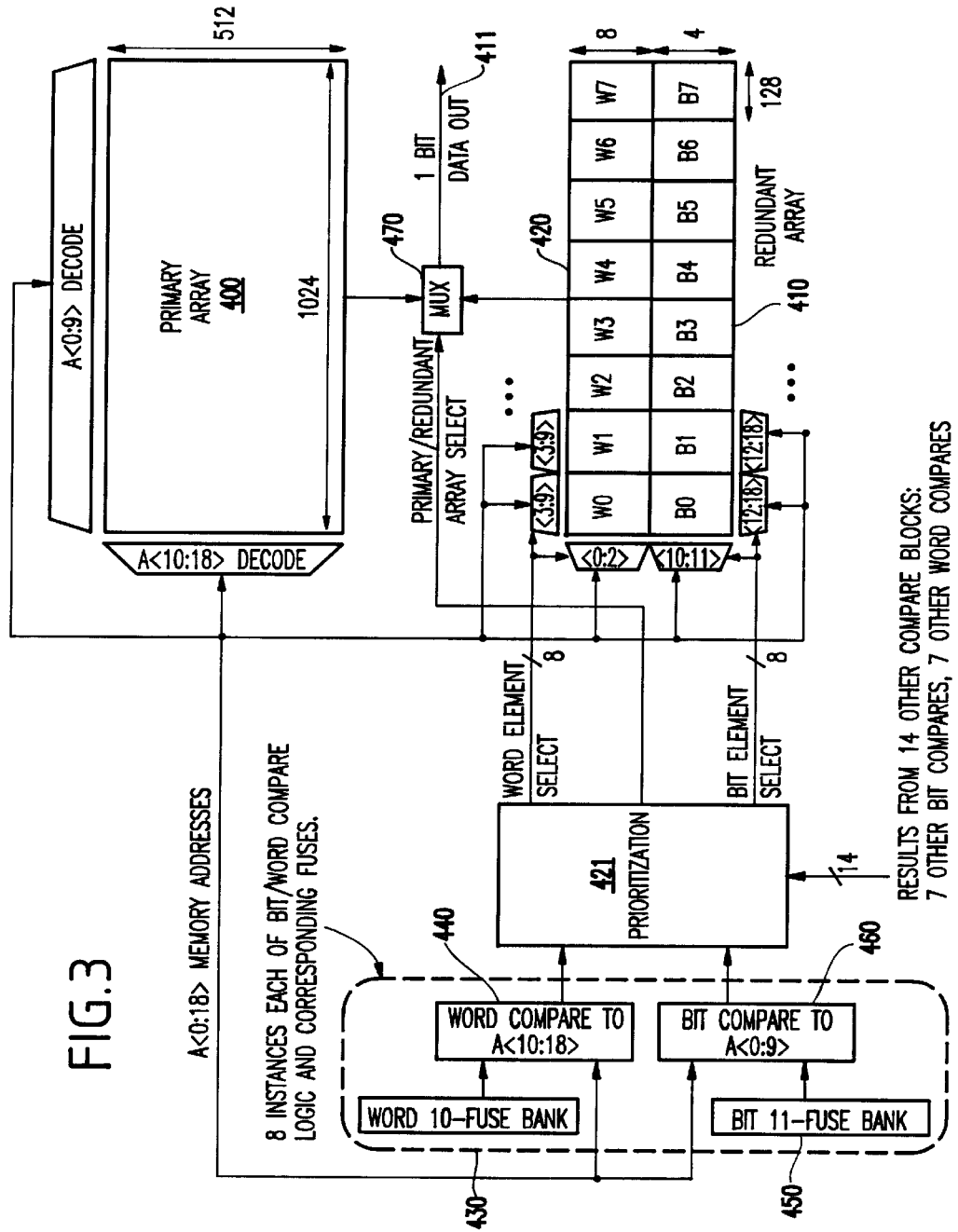
FIG. 3 is a schematic diagram of a memory array having redundant elements.
Figure 4:
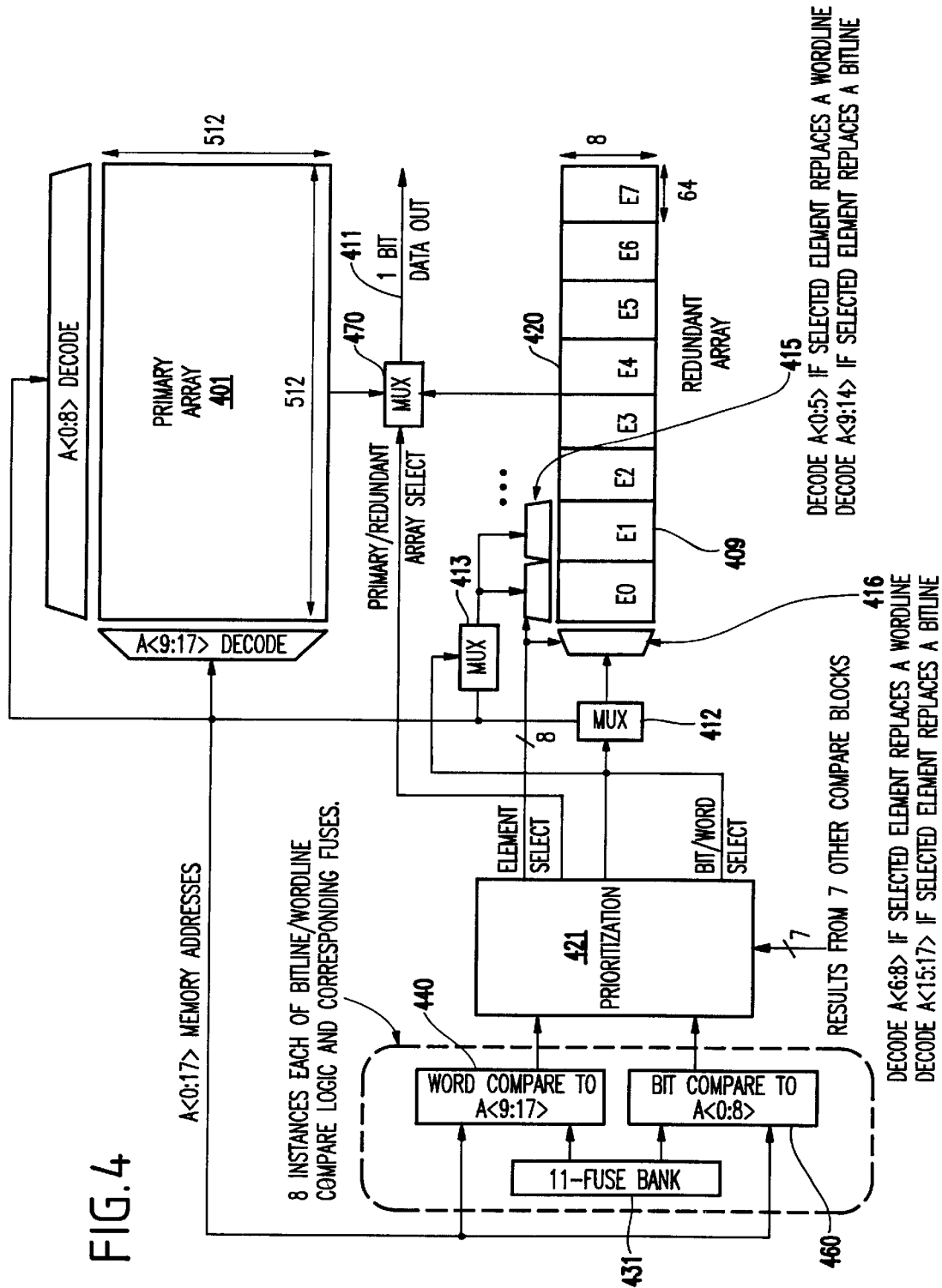
FIG. 4 is a schematic diagram of a memory array having redundant elements.

Referring now to the drawings, FIG. 3 provides a more complete illustration of the single-use redundancy of FIG. 2. However, the details of FIG. 3 are not necessarily well-known at the time of the invention and are not necessarily prior art. FIG. 4 illustrates one embodiment of the invention and the dual-use redundant elements.

In FIG. 3, the dimensions of the primary array 400 are unconstrained, though traditionally the number of rows is a power of 2 to allow easy binary decoding and the same is true for the number of columns. For illustrative purposes, the primary array 400 is shown to have 512 rows and 1024 columns. Consequently, bitline repair elements 410 must replace 512 cells, while wordline repair elements 420 must replace 1024 cells.

To invoke a wordline repair element 420 in FIG. 3, the master fuse of the Word 10-Fuse Bank 430 must be blown (typically by laser fusing). Selected ones of remaining nine fuses in the Word 10-Fuse Bank 430 must then be blown to indicate which of the 512 possible wordlines in the primary array 400 is to be replaced. Depending upon the RAM architecture, this number can vary. Each of these nine fuses is referred to as a wordline address compare fuse and as a group, these nine fuses are referred to as a redundant wordline fuse bank.

When a read or write to the primary array 400 subsequently occurs, the nine wordline addresses compare fuses in the Word-10 Fuse Bank are compared to memory addresses A10 through A18 using comparators in the compare logic 440 to determine whether the wordline to be accessed in the primary array 400 actually matches the wordline designated by the fuse values. One fuse bank exists for each redundant wordline in the redundant array. A similar arrangement of fuses 450 and comparators 460 (logic) exists for the redundant bitlines (A0–A9).

In this example, there are eight instances each of the fuse banks 430, 450 and the bitline/wordline compare logic 440, 460. However, all instances of the compare logic are not shown so as to keep the drawing clear. The comparison occurs simultaneously for all eight redundant wordline fuse banks.

When a match occurs between memory addresses A10–A18 and one of the eight redundant wordline fuse banks, one of the eight wordline repair elements is selected and the multiplexor 470 between the primary array 400 and redundant array 410, 420 steers data from the redundant array onto the 1-bit wide read data path 411 (or vice-versa for the write-data path). Memory addresses A0 through A9 are used to decode the wordline element in the redundant array as illustrated in FIG. 3. The wordline element is decoded such that only one bit in the redundant array is addressed.

To invoke a bitline repair element in FIG. 3, the master fuse of the Bit 11-Fuse Bank 450 must be blown (typically by laser fusing). The remaining 10 fuses in the Bit 11-Fuse Bank must then be blown to indicate which of the 1024 possible bitlines 410 in the primary array is to be replaced. Each of these ten fuses is referred to as a bitline address compare fuse and as a group, these ten fuses are referred to as a redundant bitline fuse bank 450. When a read or write to the primary array subsequently occurs, the ten bitline addresses compare fuses are compared to memory addresses A0 through A9 using comparators in the compare logic 460 to determine whether the bitline accessed in the primary array matches the bitline designated by the fuse values. This comparison occurs simultaneously for all eight redundant bitline fuse banks (again, one fuse bank exists for each redundant bitline in the redundant array).

When a match occurs between memory addresses A0 through A9 and one of the eight redundant bitline fuse banks, one of the bitline repair elements is selected and the multiplexor 470 between the primary array and redundant array steers data from the redundant array onto the 1-bit wide read data path 411 (or vice-versa for the write-data path). Memory addresses A10 through A18 are used to decode the bitline element in the redundant array as illustrated in FIG. 3. The bitline element is decoded such that only one bit in the redundant array is addressed.

When a match occurs to both a redundant bitline fuse bank and a redundant wordline fuse bank (a memory location in the primary array where a bitline replacement intersects a wordline replacement), prioritization circuitry 421 selects one of the two possible redundant elements and addresses the redundant array accordingly.

In FIG. 3, a wordline repair element 420 consists of 1024 redundant cells, while a bitline repair element 410 consists of 512 cells. Consequently, each redundant wordline fuse bank 430 consists of nine wordline address compare fuses, whereas each redundant bitline fuse bank 450 consists of ten bitline address compare fuses. The difference between the number of redundant cells in a wordline repair element and the number of redundant cells in a bitline element also accounts for the difference between the number of memory address signals required to decode a wordline repair element in the redundant array (ten memory address signals) and the number of memory address signals required to decode a bitline repair element in the redundant array. Due to these differences, a bitline repair element could not be used to replace a wordline in the primary array, nor could a wordline repair element be used to replace a bitline in the primary array.

In comparison, FIG. 4 illustrates a structure in which a single repair element may be used to replace either a wordline or a bitline in the primary array. Note that the dimensions of the primary array 401 are now constrained such that the number of cells in a wordline (512 cells) matches the number of cells in a bitline (512 cells). The total number of cells in the primary array of FIG. 4 (approx. 0.25 Mb) is half that of the primary army of FIG. 3 (approx. 0.5 Mb). For consistency, the redundant array now contains half as many repair elements 409 (a total of eight repair elements).

To be compatible with the constrained primary array architecture, each repair element 409 in the redundant array now contains 512 redundant cells. Because the number of cells in a wordline matches the number of cells in a bitline for the primary array of FIG. 4, the 512 redundant cells in each repair element may be used to replace either a wordline or a bitline in the primary array.

Each repair element in the redundant array of FIG. 4 has a corresponding 11-Fuse Bank 431. Again, there are eight such banks 431, although only one is shown. Of the fuses in this fuse bank 431, two are master fuses, a wordline master fuse and a bitline master fuse. The wordline master fuse designates the use of the repair element to replace a wordline in the primary array and the bitline master fuse designates the use of the repair element to replace a bitline in the primary array 401. Only one of the two master fuses may be blown for a given repair element. When neither master fuse is blown, the repair element is unused and its address compare fuses are neglected.

Figure 5:
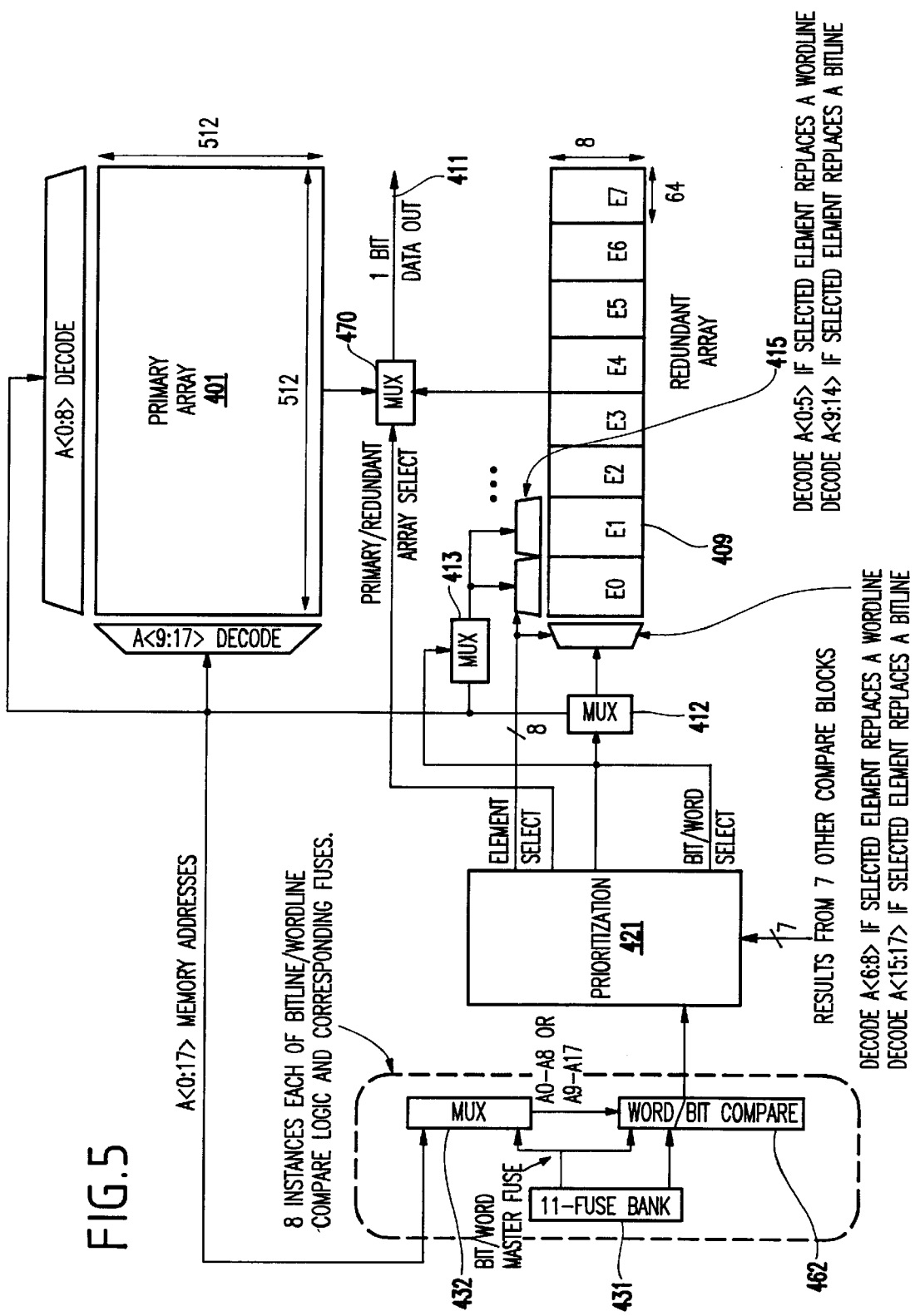
FIG. 5 is a schematic diagram of a memory array having redundant elements.

Each 11-Fuse bank 431 in FIG. 4 provides input to both word-compare 440 and bit-compare 460 logic. The wordline and bitline master fuses determine which of these two compare logic circuits is active for each repair element. As shown in FIG. 5, an alternative to including both word-compare and bit-compare logic for each repair element is to mux 432 between the two sets of possible address inputs (A0–A8 or A9–A17) to a single compare logic block 462.

Having two unique compare logic blocks allows the comparison to occur more rapidly, while having an address mux at the Input to a single compare logic block allows the compare circuitry to occupy less area on the chip.

To invoke a wordline repair element in FIG. 4, the wordline master fuse of the 11-Fuse Bank 431 must be blown (typically by laser fusing). Certain ones of the nine addresses compare fuses in the 11-Fuse Bank 431 must then be blown to indicate which of the 512 possible wordlines in the primary array is to be replaced. When a read or write to the primary array subsequently occurs, the nine addresses compare fuses are compared to memory addresses A9 through A17 using the comparators in the compare logic 440 to determine whether the wordline accessed in the primary array matches the wordline designated by the fuse values. This comparison occurs simultaneously for all eight redundant fuse banks (again, one fuse bank exists for each redundant element in the redundant array).

When a match occurs between memory addresses A9–A17 and one of the eight redundant fuse banks, one of the eight repair elements 409 is selected as a wordline replacement and the mux 470 between the primary array and redundant array steers data from the redundant array onto the 1-bit wide read data path 411 (or vice-versa for the write-data path). Memory addresses A0 through A5 are muxed as inputs to the redundant array decode circuits using multiplexors 412, 413 to decode the repair element in the redundant array as a wordline replacement. The repair element is decoded such that only one bit in the redundant array is addressed.

To invoke a bitline repair element in FIG. 4, the bitline master fuse of the 11-Fuse Bank 431 must be blown (typically by laser fusing). Ones of the remaining nine addresses compare fuses in the 11-Fuse Bank 431 must then be blown to indicate which of the 512 possible bitlines in the primary array is to be replaced. When a read or write to the primary array subsequently occurs, the nine addresses compare fuses are compared to memory addresses A0 through A8 using comparators in the compare logic 460 to determine whether the bitline accessed in the primary array matches the bitline designated by the fuse values. This comparison occurs simultaneously for all eight redundant fuse banks (one fuse bank exists for each redundant element in the redundant army).

When a match occurs between memory addresses A0–A8 and one of the eight redundant fuse banks, one of the repair elements is selected as a bitline replacement and the multiplexor 470 between the primary array and redundant array steers data from the redundant array onto the 1-bit wide read data path 411 (or vice-versa for the write-data path). Memory addresses A9 through A17 are muxed as inputs to the redundant array decode circuits 415, 416 using multiplexors 412, 413 to decode the repair element in the redundant array as a bitline replacement as illustrated in FIG. 4. The repair element is decoded such that only one bit in the redundant array is addressed. More specifically, decode unit 416 decodes addresses A6–A8 if the selected element replaces a wordline and decodes A15–A17 if the selected element replaces a bitline. Similarly, decode unit 415 decodes addresses A0–A5 if the selected element replaces a wordline and decodes A9–A14 if the selected element replaces a bitline.

For example, referring to FIG. 4, there are eight 11-fuse banks 431, each related to one of the eight redundant elements E0–E7. An address match in one of the enabled (bit or wordline master fuse is blown) fuse banks will select the corresponding redundant element. One of the eight 'Element Select' signals goes active and enables the word and bit decode circuitry 415, 416 through multiplexors 412, 413, based on signals Bit/Word Selects. For example, when a match occurs to fuse bank 0 enabled by the Wordline master fuse, signal 'Element Select' 0 will activate decode circuitry 415, 416 for redundant element E0. Signal Word Select will also be activated to steer addresses A0–A8 to the decode circuitry. If the fuse bank was enabled by the bitline master fuse, the Bit Select signal will steer addresses A9–A17 to the decode circuits.

Figure 1:
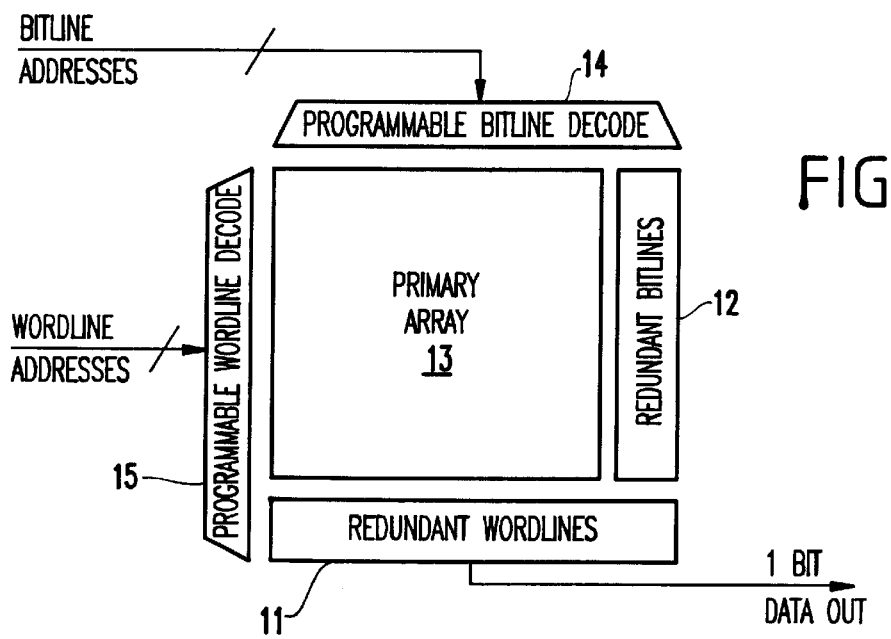
FIG. 1 is a schematic diagram of a memory array having redundant elements.

When a match occurs to both a repair element used as a bitline and a repair element used as a wordline (a memory location in the primary array where a bitline replacement intersects a wordline replacement), the prioritization circuitry 421 selects one of the two possible redundant elements and addresses the redundant array accordingly. While the structure shown in FIG. 4 illustrates a redundant array that is separate from the primary array, as shown in FIG. 1, the inventive redundant array could easily be included within the primary array.

As shown above, the invention provides repair elements that have dual-use redundancy that allows each repair element in the redundant array to be used as either a bitline repair element or a wordline repair element. By increasing the usefulness of each repair element, product yield may be held constant while the total number of repair elements may be reduced for a given memory array. Because each repair element requires programmable fuses (whether efuses or metal fuses), the invention also reduces the number of fuses required for a given array, which in turn reduces the total chip area and improves the chip wireability.

The invention reduces the number of fuses by providing more flexibility for each fuse bank, and therefore the possibility that each fuse bank can repair different defect signatures. Defects in the primary array often occur more frequently on one level of the manufacturing process than on an other. For example, defects on the metal 2 level used for the RAMs bitlines will require more bit redundant elements to increase yield, while defects on the Metal 3 level will result in the need for more wordline redundancy. The invention allows one fuse bank to repair either of these types of defects. For example, with only eight fuse banks as in FIG. 4, the invention will be able to repair eight defective wordlines on one chip, and then be used to repair eight defective bitlines on another chip. The structure shown in FIG. 3 would require 16 fuse banks to achieve this type of defect coverage. Of course, there are pathological cases that would require both eight wordline and eight bitline repairs, but this would be very rare. For the high percentage of cases, the invention provides the same defect coverage with fewer fuses. Another alternative would be to use the same number of fuses and use the invention to provide better repair ability and thus improve yields.

While the invention has been described in terms of preferred embodiments, those skilled in the art will recognize that the invention can be practiced with modification within the spirit and scope of the appended claims.

What is claimed is:

1. An integrated circuit memory structure comprising:
    a main array of memory elements having wordlines and bitlines; and
    a redundant array of redundant memory elements external to and connected to said main array,
    wherein each of said redundant memory elements can replace either one of said wordlines or one of said bitlines.

2. The integrated circuit memory structure in claim 1, wherein said wordlines and said bitlines are the same size.

3. The integrated circuit memory structure in claim 1, wherein said redundant memory elements are the same size as said wordlines and said bitlines.

4. The integrated circuit memory structure in claim 1, further comprising compare logic and corresponding fuses for identifying which one of said wordlines or said bitlines is replaced by each of said redundant memory elements.

5. The integrated circuit memory structure in claim 4, wherein said fuses include two master fuses that identify whether each of said redundant memory elements replaces one of said bitlines or one of said wordlines.

6. The integrated circuit memory structure in claim 1, further comprising at least one multiplexor/decoder for decoding a memory address to a corresponding address within said redundant memory array.

7. The integrated circuit memory structure in claim 1, further comprising a multiplexor for selectively connecting a data line to either said main array or said redundant array.

8. An integrated circuit memory structure comprising:
    a main array of memory elements having wordlines and bitlines; and
    a redundant array of redundant memory elements within said main array,
    wherein each of said redundant memory elements can replace either one of said wordlines or one of said bitlines.

9. The integrated circuit memory structure in claim 8, wherein said wordlines and said bitlines are the same size.

10. The integrated circuit memory structure in claim 8, wherein said redundant memory elements are the same size as said wordlines and said bitlines.

11. The integrated circuit memory structure in claim 8, further comprising compare logic and corresponding fuses for identifying which one of said wordlines or said bitlines is replaced by each of said redundant memory elements.

12. The integrated circuit memory structure in claim 11, wherein said fuses include two master fuses that identify whether each of said redundant memory elements replaces one of said bitlines or one of said wordlines.

13. The integrated circuit memory structure in claim 8, further comprising at least one multiplexor/decoder for decoding a memory address to a corresponding address within said redundant memory array.

14. The integrated circuit memory structure in claim 8, further comprising a multiplexor for selectively connecting a data line to either said main array or said redundant array.

15. An integrated circuit memory structure comprising:
    a main array of memory elements having wordlines and bitlines, wherein said wordlines and said bitlines are the same size; and
    a redundant array of redundant memory elements operatively connected to said main array,
    wherein each of said redundant memory elements can replace either one of said wordlines or one of said bitlines.

16. The integrated circuit memory structure in claim 15, wherein said redundant memory elements are the same size as said wordlines and said bitlines.

17. The integrated circuit memory structure in claim 15, further comprising compare logic and corresponding fuses for identifying which one of said wordlines or said bitlines is replaced by each of said redundant memory elements.

18. The integrated circuit memory structure in claim 17, wherein said fuses include two master fuses that identify whether each of said redundant memory elements replaces one of said bitlines or one of said wordlines.

19. The integrated circuit memory structure in claim 15, further comprising at least one multiplexor/decoder for decoding a memory address to a corresponding address within said redundant memory array.

20. The integrated circuit memory structure in claim 15, further comprising a multiplexor for selectively connecting a data line to either said main array or said redundant array.

* * * * *